United States Patent
Hwang et al.

(10) Patent No.: US 6,936,518 B2
(45) Date of Patent: Aug. 30, 2005

(54) CREATING SHALLOW JUNCTION TRANSISTORS

(75) Inventors: Jack Hwang, Portland, OR (US); Mitchell C. Taylor, Lake Oswego, OR (US); Mark Y. Liu, Portland, OR (US); Nick Lindert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/761,550

(22) Filed: Jan. 21, 2004

(65) Prior Publication Data

US 2005/0158957 A1 Jul. 21, 2005

(51) Int. Cl.⁷ .......................... H01L 21/336
(52) U.S. Cl. ............. 438/299; 438/197; 438/293
(58) Field of Search ............... 438/151, 197, 438/293, 299

(56) References Cited

U.S. PATENT DOCUMENTS

| | | | |
|---|---|---|---|
| 2001/0006147 A1 * | 7/2001 | Fan | 204/192.3 |
| 2003/0148563 A1 * | 8/2003 | Nishiyama | 438/197 |
| 2003/0162342 A1 * | 8/2003 | Chen et al. | 438/199 |
| 2004/0036126 A1 * | 2/2004 | Chau et al. | 257/401 |
| 2004/0164341 A1 * | 8/2004 | Forbes et al. | 257/315 |

* cited by examiner

Primary Examiner—Ngân V. Ngô
(74) Attorney, Agent, or Firm—Trop, Pruner & Hu, P.C.

(57) ABSTRACT

A polysilicon structure may be defined on a semiconductor substrate using plasma doping to dope the sidewalls and upper surface of the polysilicon material as well as the source drain extensions. Shortly after plasma doping, the structure may be encapsulated within a suitable capping layer to prevent the removal of the thin surface doped regions during subsequent semiconductor processing.

14 Claims, 1 Drawing Sheet

CREATING SHALLOW JUNCTION TRANSISTORS

BACKGROUND

This invention relates generally to forming semiconductor integrated circuits.

Semiconductor integrated circuits may include metal oxide semiconductor field effect transistors (MOSFETs) having a gate, source and drain. The fundamental driver of the electronics industry is transistor scaling. For the last 30 years, this has followed the trend of scaling transistor dimensions by 0.7× per process generation. This also requires that the shallow source/drain extensions be scaled by this geometric factor in order to not degrade the transistor performance.

Ideally, the shape and resistivity of the source drain extension needs to be preserved. Resistivity is maintained on a shallower junction by increasing dopant dose and activation. Increased dopant activation is achieved with advanced annealing technologies that anneal at higher temperatures in a shorter period of time. These annealing techniques are optimized to yield the correct amount of dopant diffusion and activation. As the junctions are scaled, the trend is towards lower thermal budgets for the anneal.

Traditionally, the junction depth has been scaled by reducing the diffusion time rather than the implant energy. The implant energy has been harder to scale because of an incomparability with the clean process used in semiconductor manufacturing. Dopants near the surface are removed during the clean process. In addition, there are implant tails and straggle that can impact the final shape of the source drain extension. Eventually, this will lead to a distortion of the shape of the source and drain extension shape.

Another component of the junction scaling is implant damage. The anneal step typically removes the defects. As the total amount of thermal energy is reduced to scale the junction, the residual damage can increase. This can have negative impact on the dopant activation. Novel transistor designs on fully depleted silicon over insulator (FDSOI) will have problems with recrystalization on oxide if the thin layer of silicon is amorphized. As gate oxides are scaled, the thinner film may be degraded more adversely by implant straggle and angular divergence.

One approach to reducing this damage involves applying doped glass followed by a diffusion drive-into form the junctions. The advantage of the doped glass method is that lattice damage is minimized and there is no implang damage. The limitation of this technique is that the peak concentration of dopants at the interface is lower than desirable for the modern complementary metal oxide semiconductor (CMOS) process.

Plasma doping enables doping at energies significantly lower than those of conventional implants and semiconductor processes. The substrate to be doped is placed directly in the plasma source while applying a bias to the substrate. Generally plasma doping is done at energy ranges of 200 ev to 5 keV. Ultra low energy plasma doping below 200 ev down to 10 eV have been attempted but have not been effectively integrated into transistor processes because of the incomparability with the clean process.

Thus, there is a need for better ways to form shallow junctions transistors.

DETAILED DESCRIPTION

Figure 1:
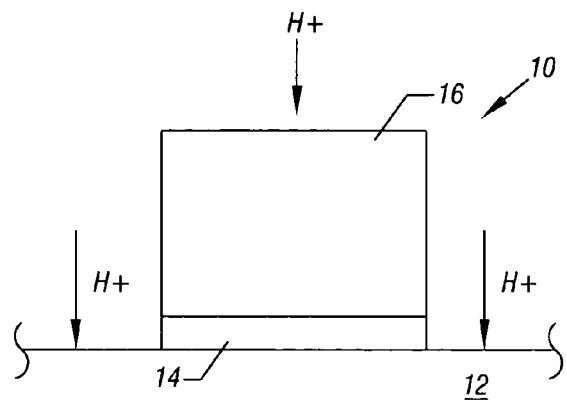
FIG. 1 is a partial, enlarged schematic cross-sectional view of initial stage in the manufacture of a shallow field effect transistor in accordance with one embodiment of the present invention.

Using conventional techniques, a gate structure 16 may be defined over a semiconductor substrate 12 with an intervening gate dielectric 14 as shown in FIG. 1. The gate structure 16 may use polysilicon, silicide, or metal, as examples. This invention is not limited to the traditional CMOS structure and is applicable to novel structures such as the "fin-fet" or the "tri-gate" transistors. Also, the sequence describes formation of a PMOS source/drain extension after the NMOS junction implant. This invention may simultaneously be applied to the NMOS in the same process flow. Because of the differential junction requirements for NMOS and PMOS, an intermediate diffusion step after the NMOS junction implant/cap is used to separately adjust the NMOS junction. The final anneal step to diffuse both NMOS and PMOS will occur later in the process flow.

In one embodiment of the present invention, the wafer 10 is a complementary metal oxide semiconductor (CMOS) wafer with the structure 16 ultimately acting as the gate electrode of a PMOS transistor. At this stage, the NMOS transistor (not shown) may be covered with an appropriate resist or other protective covering.

Figure 2:
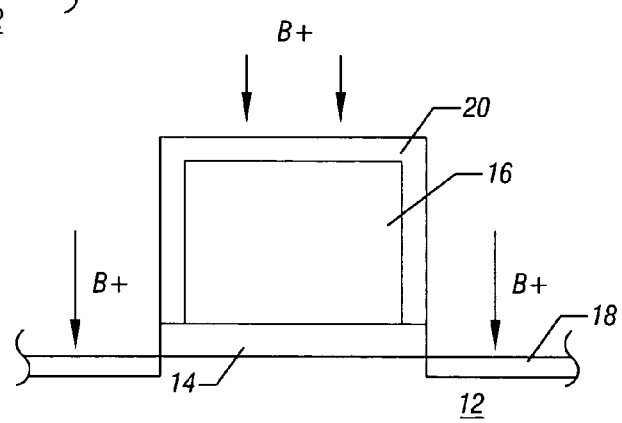
FIG. 2 is an enlarged, schematic cross-sectional view at a subsequent stage in the manufacture of a shallow junction transistor in accordance with one embodiment of the present invention.
Figure 3:
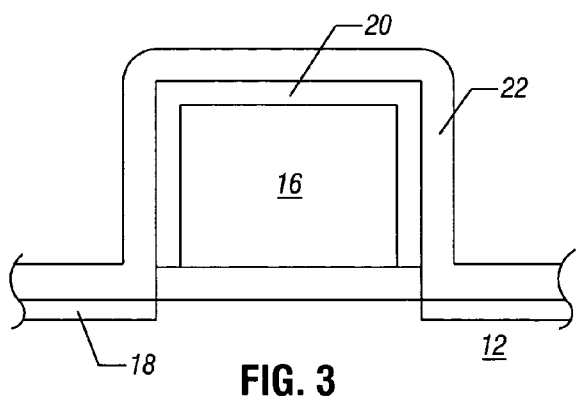
FIG. 3 is an enlarged, schematic cross-sectional view at a subsequent stage in the manufacture of a shallow junction transistor in accordance with one embodiment of the present invention.

Referring to FIG. 2, the PMOS structure may then be subjected to plasma doping to form the source/drain extensions of a graded source/drain junction. In one embodiment, the angular divergence of the plasma beam may be adjusted such that the sidewalls 17 of the gate structure 16 are doped to substantially the same extent as the upper wall 19. Thus, a fairly evenly shaped doped region 20 may be formed on the top and sides of the polysilicon structure 16 in one embodiment of the present invention.

At the same time, shallow implanted regions 18 may be formed adjacent the edges of the gate structure 16 corresponding to what ultimately will become the source and drain regions. Plasma doping may be accomplished using a variety of techniques including boron plasma doping to control the angular divergence of the dopants. The plasma doping may be accomplished at energies below 200 eV down to 10 eV in one embodiment.

In one embodiment of the invention, after the doping process, the NMOS resist is removed with a resist ash process. Afterwards, the surface is cleaned with a hydrogen plasma instead of the traditional wet clean. The use of hydrogen plasma to clean surfaces may be highly effective in removing contaminants that may interfere with subsequent shallow junction formation. The entire wafer is then capped with a protective layer that will remain on the wafer until a spacer is added to the sides of the polysilicon gate. The uncovered region is then removed.

Alternately, the NMOS resist can be left on immediately after the doping process. A low temperature CVD process can deposit a silicon film on top of both the NMOS resist area and the exposed, doped PMOS region. In a yet to be determined process, the silicon film and photoresist on the NMOS region is removed. This can be followed by either a wet clean or a dry hydrogen plasma.

In third embodiment of the present invention, the NMOS and PMOS regions may be doped without any use of photoresist in a blanket doping process and then capped. The cap layer may be deposited and then patterned to expose the NMOS area. If the dopant deposited is very shallow, then it may be removed from the NMOS region in a subsequent clean operation.

The capping layer 22 needs to be deposited in a low temperature process to avoid diffusing the junctions. An example of a material would be a CVD doped glass or silicon.

The remainder of the processing of the PMOS transistor may be completed, to the extent possible, with the capping layer 22 in place. The presence of the capping layer 22 reduces the removal of surface doping, particularly in subsequent clean processes. Using the protective capping layer 22, a very thin layer of a doping may be achieved having relatively high surface concentrations of doping with significantly reduced implant damage given the very low energies involved in some embodiments.

The cap layer is to remain until the spacer is deposited on the gate side walls. After this step, the cap layer directly beneath the spacer will be protected from subsequent cleans. Beyond the spacer, the cap layer can be removed if required. This depends on the composition of the cap layer and whether there are any processing problems downstream (ex. Salicide, implant knock-in for the source/drain implant).

Figure 4:
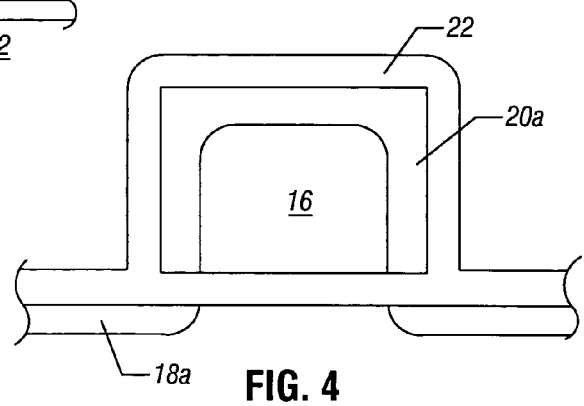
FIG. 4 is an enlarged, schematic cross-sectional view at a subsequent stage of manufacture in accordance with one embodiment of the present invention.

Thereafter, as indicated in FIG. 4, rapid thermal annealing may be utilized to diffuse the junctions to the desired depth. Diffusion dominates the final junction depth rather than the plasma doping itself. The final junction, as indicated at 18a, and the final doping within the polysilicon structure 16, as indicated at 20a, may be effective to form low damage, shallow PMOS transistor junctions. Diffusing the dopant from a high concentration at the surface will serve to increase the amount of dopant in the source/drain extension immediately underneath the polysilicon gate edge.

The use of conformal doping techniques, such as plasma doping and immersion plasma doping, may result in a reduction in the depletion depth in the polysilicon gate electrode in the structure 16 close to the gate edge. This improved polysilicon depletion enables the scaling of the source/drain under diffusion while maintaining the same overlap capacitance and transistor performance and allowing more aggressive polysilicon gate electrode scaling. As a lateral doping depth becomes comparable to a significant fraction of the polysilicon critical dimension, polysilicon depletion may be reduced.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a gate structure over a semiconductor substrate;
   using a plasma to clean the gate structure; and
   forming a portion of source drain junction using plasma doping at energies of less than approximately 100 eV.

2. The method of claim 1 wherein using plasma includes using hydrogen plasma to clean the gate structure.

3. The method of claim 1 wherein using plasma to clean includes using plasma at energies of less than approximately 100 eV.

4. The method of claim 1 including forming a source drain extension using plasma doping.

5. The method of claim 1 including covering the gate structure to reduce the loss of impurities from the gate structure.

6. A method comprising:
   using plasma doping at energies of less than approximately 100 eV to dope a gate structure with impurities; and
   covering the structure to reduce the loss of the impurities from the gate structure.

7. The method of claim 6 including using plasma to clean the gate structure prior to doping the gate structure.

8. The method of claim 6 wherein covering the structure includes covering the structure with doped glass.

9. The method of claim 6 including forming a source drain region using plasma doping.

10. The method of claim 9 wherein covering the structure includes covering both a gate and source drain regions.

11. The method of claim 6 including forming a PMOS transistor.

12. The method of claim 6 including plasma doping using boron.

13. The method of claim 6 including controlling the plasma doping to cause the gate structure top and sides to be doped to substantially the same extent.

14. The method of claim 6 including diffusing and activating the impurities using rapid thermal annealing.

* * * * *